(12) United States Patent
Lin

(10) Patent No.: US 12,394,169 B2
(45) Date of Patent: Aug. 19, 2025

(54) OPTICAL SENSOR MECHANISM CAPABLE OF MITIGATING SIGNAL NONLINEARITY

(71) Applicant: PixArt Imaging Inc., Hsin-Chu (TW)

(72) Inventor: Ming-Tse Lin, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 417 days.

(21) Appl. No.: 17/952,305

(22) Filed: Sep. 25, 2022

(65) Prior Publication Data
US 2024/0119693 A1    Apr. 11, 2024

(51) Int. Cl.
| | | |
|---|---|---|
| *G06V 10/141* | (2022.01) | |
| *G06V 10/147* | (2022.01) | |
| *G06V 10/74* | (2022.01) | |
| *H03M 1/66* | (2006.01) | |

(52) U.S. Cl.
CPC .......... *G06V 10/141* (2022.01); *G06V 10/147* (2022.01); *G06V 10/761* (2022.01); *H03M 1/66* (2013.01)

(58) Field of Classification Search
CPC .. G06V 10/141; G06V 10/147; G06V 10/761; H03M 1/181; H03M 1/66–88
See application file for complete search history.

(56) References Cited

U.S. PATENT DOCUMENTS

| | | | | |
|---|---|---|---|---|
| 8,451,227 | B2* | 5/2013 | Chao | G06F 3/0317 |
| | | | | 345/593 |
| 8,848,202 | B2* | 9/2014 | Dyer | G01S 7/481 |
| | | | | 356/9 |
| 11,284,024 | B2* | 3/2022 | Kawazu | H04N 25/59 |
| 11,356,656 | B2* | 6/2022 | Koizumi | H04N 25/78 |
| 2007/0085926 | A1* | 4/2007 | Yuyama | H04N 23/651 |
| | | | | 348/370 |

* cited by examiner

*Primary Examiner* — Stephen R Koziol
*Assistant Examiner* — Dylan J Sherrillo
(74) *Attorney, Agent, or Firm* — Winston Hsu

(57) ABSTRACT

A method of an optical sensor device includes: providing an optical sensor for receiving reflected light associated with a light emission unit to generate at least one sensed image; using a first exposure setting to make the optical sensor generate a first frame data during a first frame time period of a frame; when performing an exposure adjustment operation, using a second exposure setting to make the optical sensor generate a second frame data during a second time period of the frame neighbor to the first frame time period of the frame; and, generating a normalized digital signal corresponding to the first frame data based on the relation between the first frame data and the second frame data.

18 Claims, 4 Drawing Sheets

OPTICAL SENSOR MECHANISM CAPABLE OF MITIGATING SIGNAL NONLINEARITY

BACKGROUND OF THE INVENTION

1. Field of the Invention

The invention relates to an optical sensor mechanism, and more particularly to an optical sensor device and corresponding method.

2. Description of the Prior Art

Generally speaking, the signal nonlinearity is usually introduced into a conventional optical sensor device to affect the device's performance since the device's circuit components are implemented by using different bit resolutions to reduce the circuit costs.

SUMMARY OF THE INVENTION

Therefore one of the objectives of the invention is to provide optical sensor devices and a corresponding method, to solve the above-mentioned problems.

According to embodiments of the invention, an optical sensor device is disclosed. The optical sensor device comprises a processing circuit and an optical sensor. The processing circuit has a digital-to-analog converter (DAC) which is used to convert a digital signal into an analog signal to make a driver circuit generate a driving current to drive a light emission unit. The optical sensor is coupled to the processing circuit and is arranged for receiving reflected light associated with the light emission unit to generate at least one sensed image. During a first time period of a frame, the DAC makes the driver circuit drive the light emission unit with a first driving current and the optical sensor generates a first frame data. When performing an exposure adjustment operation, during a second time period of the frame neighbor to the first frame time period of the frame, the DAC makes the driver circuit drive the light emission unit with a second driving current and the optical sensor generates a second frame data, and the processing circuit is arranged to generate a normalized digital signal corresponding to the first frame data based on the relation between the first frame data and the second frame data.

According to the embodiments, an optical sensor device is further disclosed. The optical sensor device comprises a processing circuit and an optical sensor. The processing circuit has a digital-to-analog converter (DAC) which is used to convert a digital signal into an analog signal to make a driver circuit generate a driving current to drive a light emission unit. The optical sensor is coupled to the processing circuit and is arranged for receiving reflected light associated with the light emission unit to generate at least one sensed image. The processing circuit further has a programmable gain amplifier which is used to amplify the at least one sense image to generate an amplified image signal to an analog-to-digital converter. During a first time period of a frame, the programmable gain amplifier is arranged to generate the amplified image signal by using a first gain value and the analog-to-digital converter generates a first frame data. When performing an exposure adjustment operation, during a second time period of the frame neighbor to the first frame time period of the frame, the programmable gain amplifier is arranged to generate the amplified image signal by using a second gain value and the analog-to-digital converter generates a second frame data, and the processing circuit is arranged to generate a normalized digital signal corresponding to the first frame data based on the relation between the first frame data and the second frame data.

According to the embodiments, a method of an optical sensor device is disclosed. The method comprises: providing a processing circuit having a digital-to-analog converter (DAC) which is used to convert a digital signal into an analog signal to make a driver circuit generate a driving current to drive a light emission unit; providing an optical sensor coupled to the processing circuit for receiving reflected light associated with the light emission unit to generate at least one sensed image; using a first exposure setting to make the optical sensor generate a first frame data during a first frame time period of a frame; when performing an exposure adjustment operation, using a second exposure setting to make the optical sensor generate a second frame data during a second time period of the frame neighbor to the first frame time period of the frame; and, generating a normalized digital signal corresponding to the first frame data based on the relation between the first frame data and the second frame data.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution of an optical sensor device and method capable of reducing or mitigating signal nonlinearity cased due to the change of an exposure amount/level of the optical sensor device and/or the change of an ambient light condition.

Figure 1:
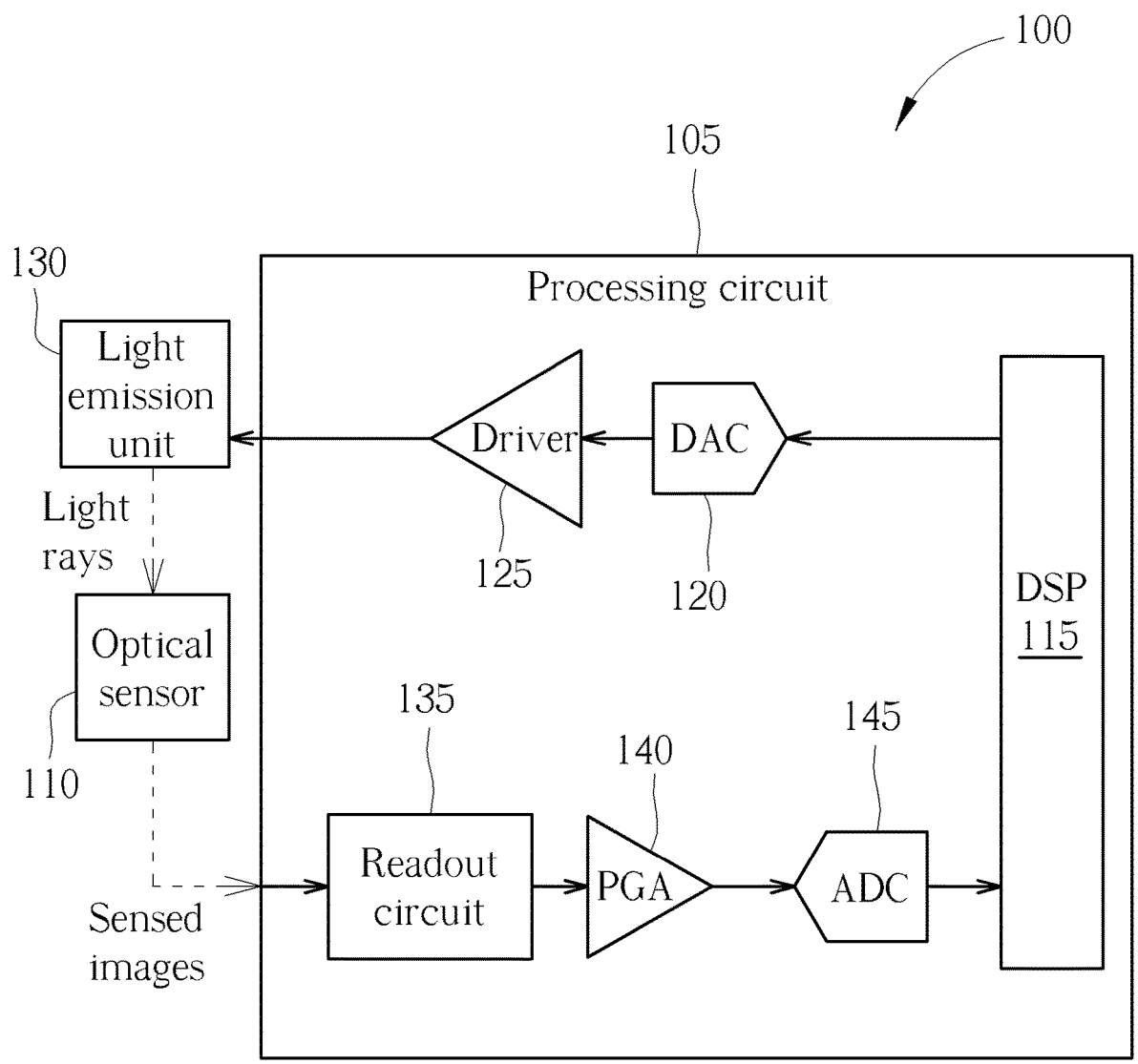
FIG. 1 is a diagram of an optical sensor device according to an embodiment of the invention.

FIG. 1 is a diagram of an optical sensor device 100 according to an embodiment of the invention. The optical sensor device 100 comprises a processing circuit 105, an optical sensor 110, and a light emission unit 130. The processing circuit 105 comprises a digital processing circuit such as a digital signal processor (DSP) 115, a digital-to-analog converter (DAC) 120, a driver (or driver circuit) 125, a readout circuit 135, an amplifier such as a programmable gain amplifier (PGA) 140, and an analog-to-digital converter (ADC) 145. The light emission unit 130 for example can be a LED (light emission diode) or a laser unit; this is not meant to be a limitation of the invention.

The DSP 115 is used to generate and output a digital signal into the DAC 120, and the DAC 120 is arranged to convert the digital signal into an analog signal. The driver 125 outputs a driving current to the light emission unit 130 based on the analog signal from the DAC 120 so that the driver 125 drives the light emission unit 130 to emit light rays with the amount of the driving current which is proportional to the light emission amount generated by the light emission unit 130. In practice, the DSP 115 can appropriately adjust the digital value of the digital signal, appropriately control a variable DAC gain value of the DAC 120 to amplify the digital value, and/or appropriately control the DAC 120 further applying a digital offset value (e.g. a positive offset value or a negative offset value) into the digital signal sent from the DSP 115, so as to adjust the analog signal outputted by the DAC 120 to correspondingly adjust the amount/level of the driving current. In other words, the DSP 115 can control the DAC 120 outputting different analog signals to make the driver 125 drive the light emission unit 130 with different corresponding driving currents.

In one embodiment, the optical sensor 110 is coupled to the processing circuit 105; in another embodiment, the optical sensor 110 may be integrated with the processing circuit 105 as a single one circuit component. The optical sensor 110 is used to receive the reflected light rays associated with the light emission unit's 130 light emissions to generate one or more sensed images and report the sensed image(s) back to the processing circuit 105. The readout circuit 135 is arranged to read and receive the sensed image(s) of the optical sensor 110 to generate at least one image signal; for example, an image signal may indicate a pixel value (or a pixel image difference) sensed by a pixel unit of a pixel array (not shown in FIG. 1) comprised by the optical sensor 110. The PGA 140 is coupled to the readout circuit 135 and is arranged to amplify the at least one image signal with a PGA gain value to generate at least one amplified image signal to the ADC 145. The ADC 145 is coupled to the PGA 140 and is used to convert the at least one amplified image signal into at least one digital image signal and transmit the at least one digital image signal to the DSP 115, and the DSP 115 can generate frame data based on the at least one digital image signal which may indicate at least one pixel value (or pixel image difference) sensed by the optical sensor 110.

To perform an exposure adjustment operation such as an automatic exposure (AE) adjustment operation in different ambient light conditions, the DSP 115 may send different digital signals to the DAC 120 and/or may control the DAC 120 in different manners so as to make the driver 125 to drive the light emission unit 130 with different driving currents at different image frame timings (or in the different ambient light conditions), so that the light exposure level/amount can be dynamically adjusted to avoid over-exposure and this makes that the waveform of an analog image signal at different frame timings (e.g. pixel values of a specific pixel unit at different timings), to be inputted to the ADC 145, will not become saturated. Similarly, to perform the automatic exposure adjustment operation, the DSP 115 can also send different control signals to control the PGA 140 adjusting its different PGA gain values to make the waveform of the analog image signal not exceed a full signal range (i.e. an input dynamic range) of the ADC 145 or a tolerable signal range of the ADC 145.

Figure 2:
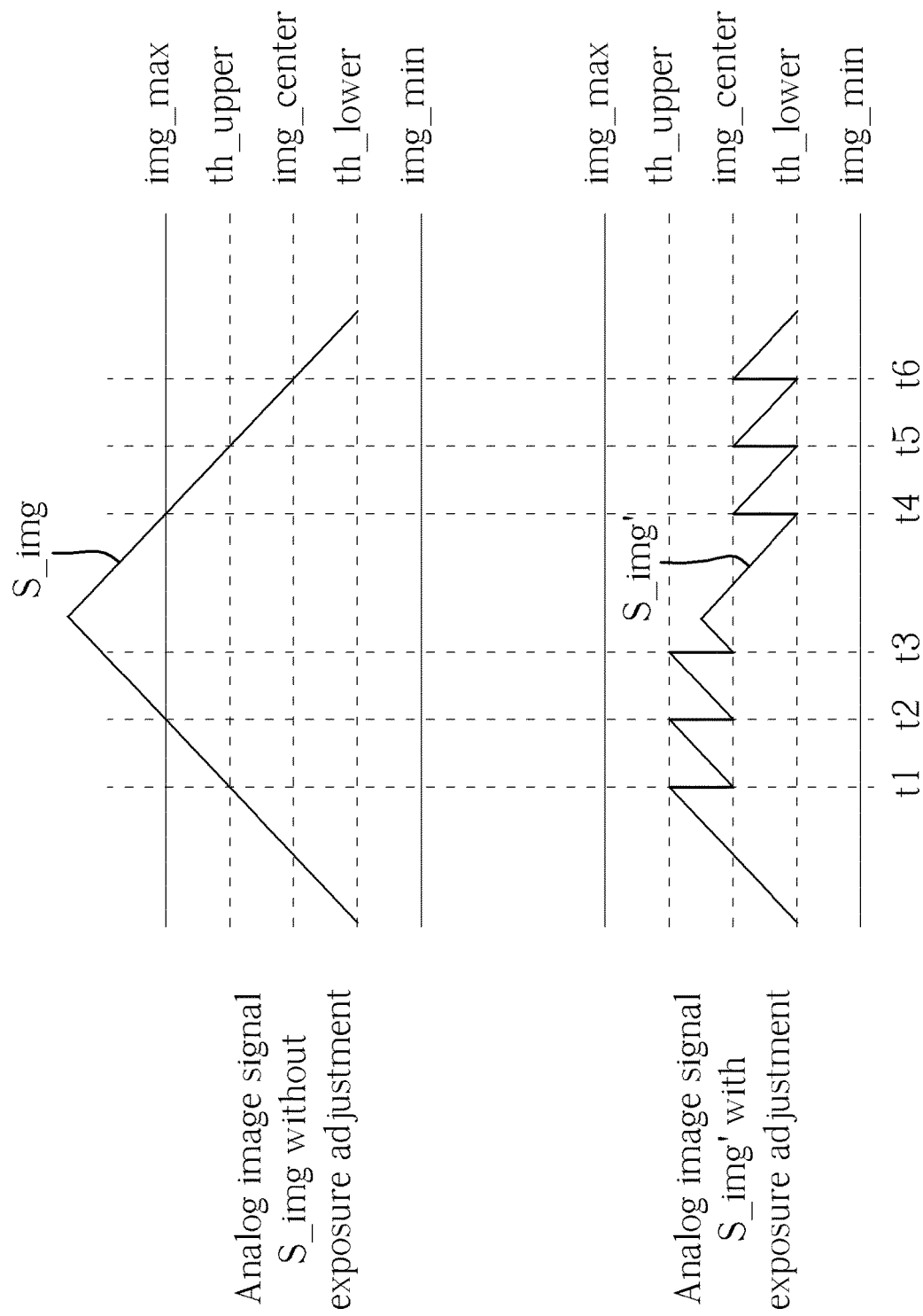
FIG. 2 is a diagram of an example of adjusting the waveform of the analog image signal S_img generated from the PGA into the ADC according to an embodiment of the invention.

FIG. 2 is a diagram of an example of adjusting the waveform of the analog image signal generated from the PGA 140 into the ADC 145 according to an embodiment of the invention. In FIG. 2, a rated full signal range, i.e. an input dynamic range, of the ADC 145 is defined by the rated maximum level img_max, the rated minimum level img_min, and the rated center level img_center. If the level of the analog image signal becomes higher than the rated maximum level img_max or becomes lower than the rated minimum level img_min, then the ADC 145 cannot correctly or accurately convert such level into a correct digital signal (or code) since the over-high or over-low level of the analog image signal will be saturated. In this situation, it is needed to employ an exposure adjustment to avoid the level saturation. In addition, the level th_upper and the level th_lower respectively indicate the tolerable upper threshold and the tolerable lower threshold. For example (but not limited), an analog image signal S_img in FIG. 2 is a hypothetical image signal without exposure adjustment, and it may be generated several times at different timings (t1, t2, . . . , t6) by using the same driving current to drive the light emission unit 130 and the same PGA gain value. The hypothetical analog image signal S_img generated at time t1 may exceed the level th_upper, the hypothetical analog image signal S_img generated at time t2 may exceed the rated maximum level img_max, and until time t4 the generated hypothetical analog image signal S_img starts to become lower than the rated maximum level img_max.

The DSP 115 for example may control the DAC 120 and/or control the PGA 140 to correspondingly adjust down the level of analog image signal S_img at times t1, t2, t3 and then to correspondingly adjust up the level of analog image signal S_img at times t4, t5, t6, respectively, so that the waveform or level of the analog image signal with the exposure adjustment, e.g. S_img', can be controlled within the tolerable signal range defined by the threshold levels th_upper and th_lower. For example, when a previous level of the analog image signal S_img, to be read out and processed by the ADC 145, becomes higher than the threshold level th_upper (or lower than the threshold level th_lower), it may be required to perform an exposure adjustment operation upon a next level of analog image signal S_img to avoid that the next level becomes higher than the rated maximum level img_max (or lower than the rated minimum level img_min). This avoids signal saturation for the ADC 145.

Then the ADC 145 can convert the adjusted image signal S_img' into an adjusted digital signal and normalize the adjusted digital signal with the corresponding factors/parameters (associated with the different driving currents and/or the gain value of the PGA 140) to generate an normalized digital signal which is associated with the waveform shape of the analog image signal S_img. After receiving the normalized digital signal, the DSP 115 ideally can obtain correct frame data based on the normalized digital signal. It should be noted that, in one situation, even though the above-mentioned exposure adjustment operation can avoid the signal saturation, however, in an example case that the exposure adjustment operation is performed to avoid a next level of the image signal become saturated, a signal/image error may be introduced between a previous level of the image signal before the exposure adjustment operation is performed and such next level after the exposure adjustment operation has be performed. Thus, in one situation, the discontinuity may occur in the normalized digital signal.

In practice, for the implementations and reducing circuit costs, the signal resolution/accuracy employed by the ADC 145 may be too low when compared to those of the other circuit components such as the DAC 120, driver 125, readout circuit 135, and/or PGA 140. Thus, actually, adjusting the driving currents and/or controlling the PGA's 140 gain value may affect the performance of ADC 145 and introduces the signal nonlinearity into the adjusted digital signal generated by the ADC 145; the signal nonlinearity may be introduced due to other different factors.

To reduce or mitigate the unexpected and undesired signal nonlinearity, the DSP 115 can further control the DAC 120 to control the driving current from driver 125 and/or control the gain value of PGA 140 so as to further generate a light exposed frame when the automatic exposure adjustment occurs, and then can calculate a compensation factor to appropriately modify a compensation parameter, which is used to correctly normalize the digital signal sent from the ADC 145, based on the further generated exposure frame. Thus, the DSP 115 can correctly calculate and obtain the normalized digital signal based on the appropriately modified compensation factor.

Figure 3:
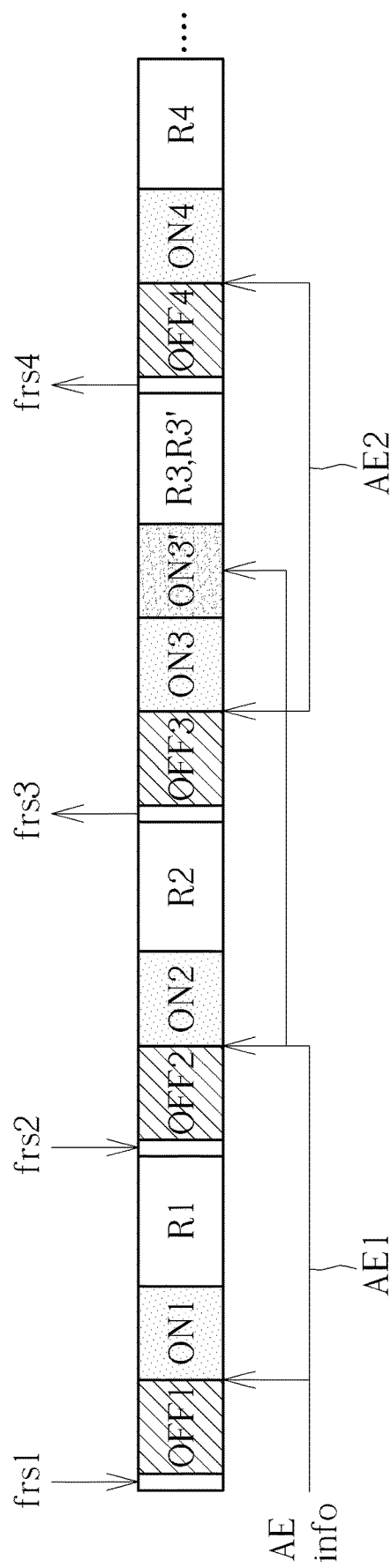
FIG. 3 is a diagram of an example of the operations of optical sensor device according to an embodiment of the invention.

FIG. 3 is a diagram of an example of the operations of optical sensor device 100 according to an embodiment of the invention. In FIG. 3, frs1, frs2, frs3, and frs4 for example respectively indicate different frame start times of the first, second, third, and fourth frames. During a frame time period, the generated and reported frame data for example comprises a image difference between a light "OFF" frame data and a light "ON" frame data, wherein the light "OFF" frame data is generated during a first time period in which the light emission unit 130 is turned off and the optical sensor 110 may sense only the ambient light to generate the light "OFF" frame data while the light "ON" frame data is generated during a second time period in which the light emission unit 130 is turned on and the optical sensor 110 may sense the ambient light and the light emitted from the unit 130 to generate the light "ON" frame data. A light "OFF" frame may be called as a dark frame, and a light "ON" frame may be called as a light frame. In this example, OFF1, OFF2, OFF3, and OFF4 respectively indicate different dark frame data generated during different light-OFF exposure time periods of the different frames, and ON1, ON2, ON3, and ON4 respectively indicate different light frame data generated during different light-ON exposure time periods of the different frames. The processing circuit 105 (or DSP 115) can generate pixel values of a frame according to the frame difference data between a dark frame data and a light frame data.

For example, in FIG. 3, after the frame start time frs1 of the first frame, the processing circuit 105 at first turns off the light emission unit 130 to make the optical sensor 110 sensing and generating a first dark frame OFF1, then turns on the light emission unit 130 and drives the light emission unit 130 with a first driving current corresponding to a first automatic exposure (AE) setting AE1 to make the optical sensor 110 sense and generate a first light frame ON1, and then the optical sensor 110 transmits and reports the first frame data R1 comprising the image difference between the first dark frame OFF1 and first light frame ON1 to the processing circuit 105.

Similarly, after the frame start time frs2, the processing circuit 105 turns off the light emission unit 130 to make the optical sensor 110 sense and generate a second dark frame OFF2, then turns on the light emission unit 130 and drives the light emission unit 130 with the first driving current corresponding to the first exposure setting AE1 to make the optical sensor 110 sense and generate a second light frame ON2, and then the optical sensor 110 transmits and reports the second frame data R2 comprising the image difference between the second dark frame OFF2 and second light frame ON2 to the processing circuit 105.

In this example, based on the result of the second light frame ON2, the processing circuit 105 may know that it is required to perform an exposure adjustment operation for a next frame to change the exposure setting from the first exposure setting AE1 to a second exposure setting AE2 so as to avoid signal saturation. Then, after the frame start time frs3, the processing circuit 105 turns off the light emission unit 130 to make the optical sensor 110 sense and generate a third dark frame OFF3, then turns on the light emission unit 130 and drives the light emission unit 130 with a different driving current such as a second driving current corresponding to the second exposure setting AE2 to make the optical sensor 110 sense and generate a third light frame ON3, then drives the light emission unit 130 with the previous driving current (i.e. the first driving current corresponding to the first exposure setting AE1) to make the optical sensor 110 sense and generate another different light frame ON3', and then the optical sensor 110 transmits and reports the third frame data R3, comprising the image difference between the third dark frame OFF3 and third light frame ON3, and another frame data R3', comprising the image difference between the third dark frame OFF3 and the different light frame ON3', respectively to the processing circuit 105.

After the frame start time frs4, similarly, the processing circuit 105 turns off the light emission unit 130 to make the optical sensor 110 sense and generate a fourth dark frame OFF4, then turns on the light emission unit 130 and drives the light emission unit 130 with the second driving current corresponding to the second exposure setting AE2 to make the optical sensor 110 sense and generate a fourth light frame ON4, and then the optical sensor 110 transmits and reports the fourth frame data R4 comprising the image difference between the fourth dark frame OFF4 and fourth light frame ON4 to the processing circuit 105.

That is, in this example (but not limited), the driving current provided for the light emission unit 130 is adjusted between the second and third frame, and during the time period of the third frame the light-ON exposure operation is performed twice to generate the third frame data R3 and the different frame data R3' so as to avoid signal saturation of frame data.

For instance, adjusting the light exposure amount/level by adjusting the driving current of the driver 125 may be implemented by controlling the DAC 120 using a different DAC gain value or using a DAC offset value. The following table shows a first scenario example in FIG. 3 by using a different DAC gain value to change the driving current:

|  | First frame | Second frame | Third frame | Fourth frame |
| --- | --- | --- | --- | --- |
| AF info | AE1 | AE1 | AE1 -> AE2 | AE2 |
| DAC gain | DAC1 | DAC1 | DAC2, DAC1 | DAC2 |
| ADC raw data | (ON1-OFF1) | (ON2-OFF2) | (ON3 − OFF3), (ON3' − OFF3) | (ON4 − OFF4) |

|     | First frame | Second frame | Third frame | Fourth frame |
| --- | --- | --- | --- | --- |
| Fac |  |  | $\dfrac{(ON3' - OFF3)}{(ON3 - OFF3)}$ |  |
| P1  | DAC1 | DAC1 | $\dfrac{DAC1}{Fac}$ | $\dfrac{DAC1}{Fac}$ |
| N1  | $\dfrac{(ON1 - OFF1) \times 2^N}{(DAC1)}$ | $\dfrac{(ON2 - OFF2) \times 2^N}{(DAC1)}$ | $\dfrac{(ON3 - OFF3) \times 2^N}{\left(\dfrac{DAC1}{Fac}\right)}$ | $\dfrac{(ON4 - OFF4) \times 2^N}{\left(\dfrac{DAC1}{Fac}\right)}$ |

As shown above, in practice, after the dark frame OFF1 is generated, for generating the light frame data ON1 of the first frame, based on the first exposure setting AE1, the processing circuit 105 (or DSP 115) controls the DAC 120 using the DAC gain value DAC1 corresponding to the exposure setting AE1 to convert a digital signal sent from the DSP 115 into an analog signal which is to be transmitted to the driver 125, and the driver 125 drives the light emission unit 130 with a driving current corresponding to the analog signal which is associated with the DAC gain value DAC1 of exposure setting AE1. In one embodiment, the optical sensor 110 may transmit an image difference between the sensed dark frame data and light frame data to the readout circuit 135 which passes the image difference to the PGA 140, and the PGA 145 amplifies the image difference with the programmable gain value to generate an amplified image difference to the ADC 145. The ADC 145 converts the amplified image difference into a raw data signal (ON1–OFF1) which is transmitted to the DSP 115 wherein OFF1 is the dark frame data and ON1 is the light frame data. In other embodiments, the image difference or raw data signal (ON1–OFF1) may be calculated by the DSP 115, and this also obeys the spirit of the invention.

After receiving or calculating the raw data signal (ON1–OFF1), the DSP 115 is arranged to recover information or data from the raw data signal (ON1–OFF1) to generate a normalized digital signal based on a compensation parameter and the exposure condition/setting of the read out image data no matter whether the driving current is adjusted or the gain value is adjusted. For example, in this situation, an exposure adjustment does not occur, the DSP 115 uses the non-compensated DAC gain value, i.e. DAC1, as a compensation parameter P1 to calculate and obtain a normalized digital signal N1, i.e.

$$\dfrac{(ON1 - OFF1) \times 2^N}{(DAC1)},$$

wherein N is a bit width of the DAC 120.

Similarly, after the dark frame OFF2 is generated, for generating the light frame data ON2 of the second frame, based on the first exposure setting AE1, the processing circuit 105 (or DSP 115) controls the DAC 120 using the same DAC gain value DAC1 corresponding to the exposure setting AE1 to convert the digital signal sent from the DSP 115 into the analog signal which is to be transmitted to the driver 125, and the driver 125 drives the light emission unit 130 with a same driving current corresponding to the analog signal which is associated with the DAC gain value DAC1 of exposure setting AE1. In this situation, similarly, the ADC 145 converts the amplified image difference into a raw data signal (ON2–OFF2) which is transmitted to the DSP 115 wherein OFF2 is the dark frame data and ON2 is the light frame data. In this situation, the exposure adjustment does not occur, the DSP 115 uses the same and non-compensated DAC gain value, i.e. DAC1, as the compensation parameter P1 to calculate and obtain a normalized digital signal N1, i.e.

$$\dfrac{(ON2 - OFF2) \times 2^N}{(DAC1)}.$$

After the dark frame OFF3 is generated, for generating the light frame data ON3 of the third frame, based on a changed exposure setting such as the second exposure setting AE2, the processing circuit 105 (or DSP 115) controls the DAC 120 using the DAC gain value DAC2 corresponding to the exposure setting AE2 to convert the digital signal sent from the DSP 115 into the analog signal which is transmitted to the driver 125, and the driver 125 drives the light emission unit 130 with a driving current corresponding to the analog signal which is associated with the DAC gain value DAC2 of an exposure setting AE2. In this situation, similarly, the ADC 145 converts the amplified image difference into a raw data signal (ON3–OFF3) which is transmitted to the DSP 115 wherein OFF3 is the dark frame data and ON3 is the light frame data. In this situation, since the exposure adjustment occurs (it changes from the exposure setting AE1 to the exposure setting AE2), the processing circuit 105 (or DSP 115) further controls the DAC 120 using a previous DAC gain value (i.e. the DAC gain value DAC1) to convert the digital signal sent from the DSP 115 into the analog signal which is transmitted to the driver 125, and thus the driver 125 drives the light emission unit 130 with a previous driving current corresponding to the analog signal which is associated with the DAC gain value DAC1 of exposure setting AE1. Then, similarly, the ADC 145 can convert another amplified image difference into another raw data signal (ON3'–OFF3) which is transmitted to the DSP 115 wherein ON3' is another light frame data generated based on a previous exposure setting. The DSP 115 calculates a compensation factor Fac based on the relation between the frame data corresponding to the previous exposure setting AE1 and the frame data corresponding to the current exposure setting AE2; the relation for example is a ratio. In this example, the DSP 115 calculates the compensation factor Fac as $$\dfrac{(ON3' - OFF3)}{(ON3 - OFF3)},$$

and it divides the previous DAC gain value, i.e. DAC1, with such compensation factor Fac to generate the compensation parameter P1', i.e.

$$\frac{DAC1}{Fac}.$$

That is, the DAC gain value is not changed, and the compensation parameter is changed from P1 into P1'. The DSP 115 then calculates and obtains the normalized digital signal N1', i.e.

$$\frac{(ON3 - OFF3) \times 2^N}{\left(\frac{DAC1}{Fac}\right)},$$

according to the updated compensation parameter P1. Further, in one example, the compensation parameter P1 may be represented by using either the DAC gain value DAC1 or the different DAC gain value DAC2, and the compensation factor Fac is correspondingly represented by using a different way. Further, it should be noted that, in other embodiments, the light frame data ON3 may be generated before the light frame data ON3' which is generated based on the previous exposure setting; this is not intended to be a limitation.

Then, similarly, after the dark frame OFF4 is generated, for generating the light frame data ON4 of the fourth frame, based on the second exposure setting AE2, the processing circuit 105 (or DSP 115) controls the DAC 120 using the DAC gain value DAC2 corresponding to the exposure setting AE2 to convert the digital signal sent from the DSP 115 into the analog signal which is to be transmitted to the driver 125, and the driver 125 drives the light emission unit 130 with the driving current corresponding to the analog signal which is associated with the DAC gain value DAC2 of exposure setting AE2. In this situation, similarly, the ADC 145 converts the amplified image difference into a raw data signal (ON4–OFF4) which is transmitted to the DSP 115 wherein OFF4 is the dark frame data and ON4 is the light frame data. In this situation, the exposure adjustment does not occur, and the DSP 115 uses a previous DAC gain value, i.e.

$$\frac{DAC1}{Fac},$$

as the compensation parameter P1 without adjusting the previous DAC gain value to calculate and obtain the normalized digital signal N1, i.e.

$$\frac{(ON4 - OFF4) \times 2^N}{\left(\frac{DAC1}{Fac}\right)},$$

wherein Fac is the compensation factor calculated in a previous frame.

Further, adjusting the light exposure amount/level by adjusting the driving current of the driver 125 may be implemented by controlling the DAC 120 using a different DAC offset value. The following table shows a second scenario example in FIG. 3 by using a different DAC offset value to change the driving current:

|  | First frame | Second frame | Third frame | Fourth frame |
| --- | --- | --- | --- | --- |
| DAC | Offset_1 | Offset_1 | Offset_2, Offset_1 | Offset_2 |
| ADC raw data | (ON1 - OFF1) | (ON2 - OFF2) | (ON3 - OFF3), (ON3' - OFF3) | (ON4 - OFF4) |
| Fac |  |  | (ON3' - OFF3) - (ON3 - OFF3) |  |
| P1 | Offset_1 | Offset_1 | Offset_1 - Fac | Offset_1 - Fac |
| N1 | (ON1 - OFF1) - Offset_1 | (ON2 - OFF2) - Offset_1 | (ON3 - OFF3) - (Offset_1 - Fac) | (ON4 - OFF4) - (Offset_1 - Fac) |

As shown above, in practice, after the dark frame OFF1 is generated, for generating the light frame data ON1 of the first frame, the processing circuit 105 (or DSP 115) controls the DAC 120 further applying the DAC offset value Offset_1 (in this example it is an initial offset value) into a digital signal sent from the DSP 115 and using a specific DAC gain value to convert the changed digital signal into an analog signal which is transmitted to the driver 125. The driver 125 drives the light emission unit 130 with an offset driving current corresponding to the analog signal which is associated with the DAC offset value Offset_1. In one embodiment, the optical sensor 110 may transmit an image difference between the sensed dark frame data and light frame data to the readout circuit 135 which passes the image difference to the PGA 140, and the PGA 145 amplifies the image difference with the programmable gain value to generate an amplified image difference to the ADC 145. The ADC 145 converts the amplified image difference into a raw data signal (ON1–OFF1) which is transmitted to the DSP 115 wherein OFF1 is the dark frame data and ON1 is the light frame data. In other embodiments, the image difference or raw data signal (ON1–OFF1) may be calculated by the DSP 115, and this also obeys the spirit of the invention.

After receiving or calculating the raw data signal (ON1–OFF1), the DSP 115 is arranged to recover information or data from the raw data signal (ON1–OFF1) to generate a normalized digital signal based on a compensation parameter and the exposure condition/setting of the read out image data no matter whether the driving current is adjusted or the gain value is adjusted. For example, in this situation, the exposure adjustment does not occur, the DSP 115 uses the non-compensated DAC offset value, i.e. Offset_1, as a compensation parameter P1 to calculate and obtain a normalized digital signal {(ON1–OFF1)–Offset_1}.

Similarly, after the dark frame OFF2 is generated, for generating the light frame data ON2 of the second frame, the processing circuit 105 (or DSP 115) controls the DAC 120 applying the same DAC offset value Offset_1 corresponding to the exposure setting AE1 into the digital signal sent from the DSP 115, and thus the driver 125 driving the light emission unit 130 with the same offset driving current associated with the DAC offset value Offset_1. In this situation, similarly, the ADC 145 converts the amplified image difference into a raw data signal (ON2−OFF2) which is transmitted to the DSP 115 wherein OFF2 is the dark frame data and ON2 is the light frame data. In this situation, the exposure adjustment does not occur, the DSP 115 uses the same and non-compensated DAC offset value, i.e. Offset_1, as a parameter P1 to calculate and obtain a normalized digital signal {(ON2−OFF2)−Offset_1}.

After the dark frame OFF3 is generated, for generating the light frame data ON3 of the third frame, based on a changed exposure setting such as the second exposure setting AE2, the processing circuit 105 (or DSP 115) controls the DAC 120 applying a different DAC offset value Offset_2 corresponding to the exposure setting AE2 into the digital signal sent from the DSP 115 and then converting such digital signal into the analog signal which is transmitted to the driver 125, so that the driver 125 driving the light emission unit 130 with a different offset driving current associated with the different DAC offset value Offset_2 of an exposure setting AE2. In this situation, similarly, the ADC 145 converts the amplified image difference into a raw data signal (ON3−OFF3) which is transmitted to the DSP 115 wherein OFF3 is the dark frame data and ON3 is the light frame data. In this situation, since the exposure adjustment occurs (it changes from the exposure setting AE1 to the exposure setting AE2), the processing circuit 105 (or DSP 115) then further controls the DAC 120 applying a previous DAC offset value (i.e. the DAC offset value Offset_1) into the digital signal sent from the DSP 115 and converting such digital signal into the analog signal which is transmitted to the driver 125, so that the driver 125 driving the light emission unit 130 with a previous driving current associated with the DAC offset value Offset_1 of exposure setting AE1. Then, similarly, the ADC 145 can convert another amplified image difference sent from the PGA 140 into another raw data signal (ON3'−OFF3) which is transmitted to the DSP 115 wherein ON3' is another light frame data generated based on the previous exposure setting. The DSP 115 calculates a compensation factor Fac based on the relation between the frame data corresponding to the previous exposure setting AE1 and the frame data corresponding to the current exposure setting AE2; the relation for example is a difference. In this example, the DSP 115 calculates the compensation factor Fac as {(ON3'−OFF3)−(ON3−OFF3)}, and it generates the compensation parameter, i.e. {Offset_1−Fac}. That is, the DAC offset value is not changed, and the compensation parameter is changed from Offset_1 into Offset_1−Fac. The DSP 115 then calculates and obtains a updated normalized digital signal {(ON3−OFF3)−(Offset_1−Fac)} according to the updated compensation parameter. Further, in one example, the compensation parameter P1 in this example may be represented by using either the DAC offset value Offset_1 or the different DAC offset value Offset_2, and the compensation factor Fac is correspondingly represented by using a different way. Further, it should be noted that, in other embodiments, the light frame data ON3 may be generated before the light frame data ON3' which is generated based on the previous exposure setting; this is not intended to be a limitation.

Then, similarly, after the dark frame OFF4 is generated, for generating the light frame data ON4 of the fourth frame, the processing circuit 105 (or DSP 115) controls the DAC 120 applying the DAC offset value Offset_2 into the digital signal sent from the DSP 115 and converting such digital signal into the analog signal which is to be transmitted to the driver 125, so that the driver 125 driving the light emission unit 130 with the offset driving current associated with the DAC offset value Offset_2. In this situation, similarly, the ADC 145 converts the amplified image difference sent from the PGA 140 into a raw data signal (ON4−OFF4) which is transmitted to the DSP 115 wherein OFF4 is the dark frame data and ON4 is the light frame data. In this situation, the exposure adjustment does not occur, and the DSP 115 uses a previous compensation parameter, i.e. the compensated DAC offset value {Offset_1−Fac}, to calculate and obtain a normalized digital signal {(ON4−OFF4)−(Offset_1−Fac)} wherein Fac is the compensation factor calculated in a previous frame (i.e. the third frame).

Further, adjusting the light exposure amount/level of the image may be implemented by controlling the PGA 140 using a different PGA gain value. The following table shows a third scenario example in FIG. 3 by using a different PGA gain value to change the light exposure amount/level:

| | First frame | Second frame | Third frame | Fourth frame |
|---|---|---|---|---|
| AE info | AE1 | AE1 | AE1 −> AE2 | AE2 |
| PGA gain | PGA1 | PGA1 | PGA2, PGA1 | PGA2 |
| ADC raw data | (ON1 − OFF1) | (ON2 − OFF2) | (ON3 − OFF3), (ON3' − OFF3) | (ON4 − OFF4) |
| Fac | | | $\frac{(ON3' - OFF3)}{(ON3 - OFF3)}$ | |
| P1 | PGA1 | PGA1 | $\frac{PGA1}{Fac}$ | $\frac{PGA1}{Fac}$ |
| N1 | $\frac{(ON1 - OFF1) \times 2^M}{(PGA1)}$ | $\frac{(ON2 - OFF2) \times 2^M}{(PGA1)}$ | $\frac{(ON3 - OFF3) \times 2^M}{\left(\frac{PGA1}{Fac}\right)}$ | $\frac{(ON4 - OFF4) \times 2^M}{\left(\frac{PGA1}{Fac}\right)}$ |

As shown above, based on the first exposure setting AE1, the processing circuit 105 (or DSP 115) controls the PGA 140 using the PGA gain value PGA1 corresponding to the exposure setting AE1 to amplify an image difference between the sensed dark frame data and light frame data sent from the readout circuit 135 to generate an amplified image difference to the ADC 145. The ADC 145 converts the amplified image difference into the raw data signal (ON1–OFF1) which is transmitted to the DSP 115 wherein OFF1 is the dark frame data and ON1 is the light frame data. In other embodiment, the PGA 140 may use the PGA gain value PGA1 corresponding to the exposure setting AE1 to amplify the sensed dark frame data and light frame data sent from the readout circuit 135, and the ADC 145 converts the amplified frame data into two data signals which are transmitted to the DSP 115. Then, the image difference or raw data signal (ON1–OFF1) is calculated by the DSP 115.

After receiving or calculating the raw data signal (ON1–OFF1), the DSP 115 is arranged to recover information or data from the raw data signal (ON1–OFF1) to generate a normalized digital signal based on a compensation parameter and the exposure condition/setting of the read out image data no matter whether the driving current is adjusted or the gain value is adjusted. For example, in this situation, the exposure adjustment does not occur, the DSP 115 uses the non-compensated PGA gain value, i.e. PGA1, as a compensation parameter P1 to calculate and obtain a normalized digital signal N1, i.e. $(ON1-OFF1) \times 2^M$, wherein in this example M is a bit width of the PGA 140.

Similarly, after frame start time frst2, the processing circuit 105 (or DSP 115) controls the PGA 140 using the same PGA gain value PGA1 corresponding to the exposure setting AE1 to amplify an image difference between the sensed dark frame data and light frame data sent from the readout circuit 135 to generate an amplified image difference to the ADC 145. The ADC 145 converts the amplified image difference into the raw data signal (ON2–OFF2) which is transmitted to the DSP 115 wherein OFF2 is the dark frame data and ON2 is the light frame data. In this situation, the exposure adjustment does not occur, the DSP 115 uses the same and non-compensated PGA gain value, i.e. PGA1, as the compensation parameter P1 to calculate and obtain a normalized digital signal N1, i.e.

$$\frac{(ON2-OFF2) \times 2^M}{(PGA1)}.$$

After the frame start time frs3, based on a changed exposure setting such as the second exposure setting AE2, the processing circuit 105 (or DSP 115) controls the PGA 140 using the PGA gain value PGA2 corresponding to the exposure setting AE2 to amplify an image difference between the sensed dark frame data and light frame data sent from the readout circuit 135 to generate an amplified image difference to the ADC 145. Similarly, the ADC 145 converts the amplified image difference into a raw data signal (ON3–OFF3) which is transmitted to the DSP 115 wherein OFF3 is the dark frame data and ON3 is the light frame data. In this situation, since the exposure adjustment occurs (it changes from the exposure setting AE1 to the exposure setting AE2), the processing circuit 105 (or DSP 115) further controls the PGA 140 using a previous PGA gain value (i.e. the PGA gain value PGA1) to amplify an image difference between the sensed dark frame data and a corresponding light frame data sent from the readout circuit 135 to generate another amplified image difference to the ADC 145. Similarly, the ADC 145 can convert the another amplified image difference into another raw data signal (ON3'–OFF3) which is transmitted to the DSP 115 wherein ON3' is the another corresponding light frame data generated based on a previous exposure setting. In this example, the DSP 115 calculates the compensation factor Fac as $$\frac{(ON3'-OFF3)}{(ON3-OFF3)},$$

and it divides the previous PGA gain value, i.e. PGA1, with such compensation factor Fac to generate the compensation parameter, i.e.

$$\frac{PGA1}{Fac}.$$

That is, the PGA gain value is not changed, and the compensation parameter is changed from PGA1 into $$\frac{PGA1}{Fac}.$$

The DSP 115 then calculates and obtains the normalized digital signal N1, i.e.

$$\frac{(ON3-OFF3) \times 2^M}{\left(\frac{PGA1}{Fac}\right)},$$

according to the updated compensation parameter $$\frac{PGA1}{Fac}.$$

Further, in one example, the compensation parameter P1 may be represented by using either the PGA gain value PGA1 or the different PGA gain value PGA2, and the compensation factor Fac is correspondingly represented by using a different way. Further, it should be noted that, in other embodiments, the light frame data ON3 may be generated before the light frame data ON3' which is generated based on the previous exposure setting; this is not intended to be a limitation.

Then, similarly, after the frame start time frs4, based on the second exposure setting AE2, the processing circuit 105 (or DSP 115) controls the PGA 140 using the PGA gain value PGA2 corresponding to the exposure setting AE2 to amplify an image difference between the sensed dark frame data and light frame data sent from the readout circuit 135 to generate an amplified image difference to the ADC 145. The ADC 145 converts the amplified image difference into a raw data signal (ON4–OFF4) which is transmitted to the DSP 115 wherein OFF4 is the dark frame data and ON4 is the light frame data. In this situation, the exposure adjustment does not occur, and the DSP 115 uses a previous DAC gain value, i.e.

$$\frac{PGA1}{Fac},$$

as the compensation parameter P1 without adjusting the previous PGA gain value to calculate and obtain the normalized digital signal N1, i.e.

$$\frac{(ON4 - OFF4) \times 2^M}{\left(\frac{PGA1}{Fac}\right)},$$

wherein Fac is the compensation factor calculated in a previous frame.

Figure 4:
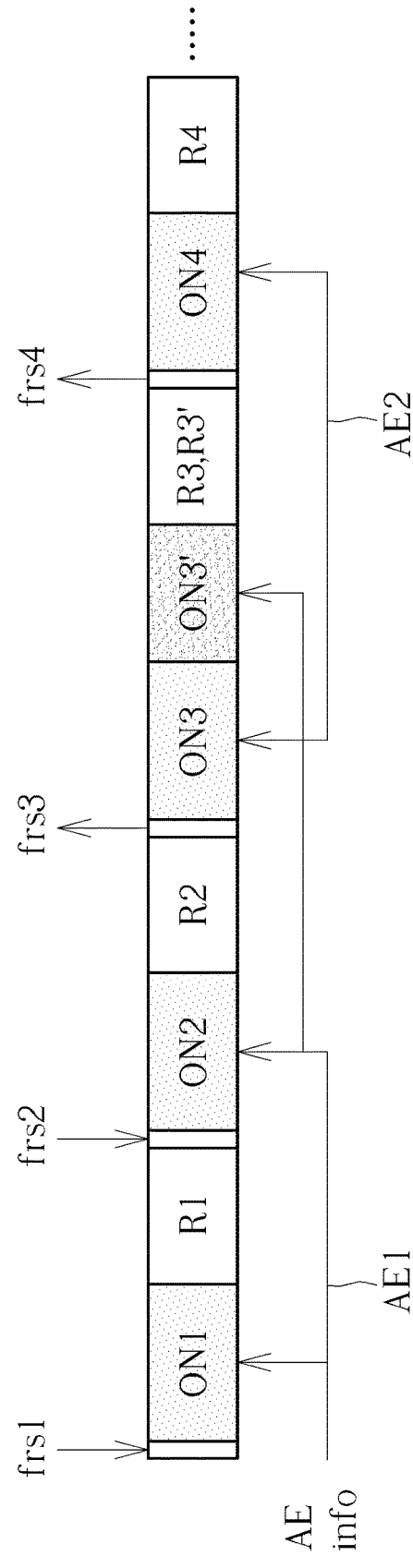
FIG. 4 is a diagram of another example of the operations of optical sensor device according to another embodiment of the invention.

Additionally, generating the dark frame(s) may be optional in other embodiments. FIG. 4 is a diagram of another example of the operations of optical sensor device 100 according to another embodiment of the invention. In FIG. 4, compared to FIG. 3, the optical sensor 110 may not generate the light "OFF" frame data, i.e. the dark frame(s), and the optical sensor 110 is arranged to transmit and report the light frames to the processing circuit 105. For example, in this embodiment, the optical sensor 110 may transmit and report the frame data R1, R2, R3, R3' and R4 respectively comprising only the light frame ON1, ON2, ON3, ON3' and ON4. In one embodiment, the optical sensor 110 may immediately transmit and report the frame data R3 after processing the light frame ON3, and the optical sensor 110 may immediately transmit and report the frame data R3' after processing the light frame ON3'. Alternatively, in other embodiment, the optical sensor 110 may transmit and report the frame data R3 and R3' after processing the light frames ON3 and ON3'. Alternatively, in another embodiment, the light frame ON3 may be processed after the light frame ON3' has been processed, i.e. the frame data R3 may be transmitted and reported after the frame data R3' has been transmitted and reported.

Further, in one embodiment, the second exposure setting may be an exposure setting used in a frame previously to the output frame, and the first exposure setting is an exposure setting used in a frame next to the output frame. This modification also falls within the scope of the invention.

The other descriptions are similar to those mentioned in FIG. 3 and are not detailed for brevity.

Based on the example of FIG. 4, the following tables respectively show different scenario examples in FIG. 4.

|  | First frame | Second frame | Third frame | Fourth frame |
|---|---|---|---|---|
| AE info | AE1 | AE1 | AE1 –> AE2 | AE2 |
| DAC gain | DAC1 | DAC1 | DAC2, DAC1 | DAC2 |
| ADC raw data | ON1 | ON2 | ON3, ON3' | ON4 |
| Fac |  |  | $\frac{ON3'}{ON3}$ |  |
| P1 | DAC1 | DAC1 | $\frac{DAC1}{Fac}$ | $\frac{DAC1}{Fac}$ |
| N1 | $\frac{ON1 \times 2^N}{(DAC1)}$ | $\frac{ON2 \times 2^N}{(DAC1)}$ | $\frac{ON3 \times 2^N}{\left(\frac{DAC1}{Fac}\right)}$ | $\frac{ON4 \times 2^N}{\left(\frac{DAC1}{Fac}\right)}$ |

|  | First frame | Second frame | Third frame | Fourth frame |
|---|---|---|---|---|
| DAC | Offset_1 | Offset_1 | Offset_2, Offset_1 | Offset_2 |
| ADC raw data | ON1 | ON2 | ON3, ON3' | ON4 |
| Fac |  |  | (ON3' - ON3) |  |
| P1 | Offset_1 | Offset_1 | Offset_1 - Fac | Offset_1 - Fac |
| N1 | ON1 - Offset_1 | ON2 - Offset_1 | ON3 - (Offset_1 - Fac) | ON4 - (Offset_1 - Fac) |

|  | First frame | Second frame | Third frame | Fourth frame |
|---|---|---|---|---|
| AE info | AE1 | AE1 | AE1 –> AE2 | AE2 |
| PGA gain | PGA1 | PGA1 | PGA2, PGA1 | PGA2 |
| ADC raw data | ON1 | ON2 | ON3, ON3' | ON4 |
| Fac |  |  | $\frac{ON3'}{ON3}$ |  |
| P1 | PGA1 | PGA1 | $\frac{PGA1}{Fac}$ | $\frac{PGA1}{Fac}$ |
| N1 | $\frac{ON1 \times 2^M}{(PGA1)}$ | $\frac{ON2 \times 2^M}{(PGA1)}$ | $\frac{ON3 \times 2^M}{\left(\frac{PGA1}{Fac}\right)}$ | $\frac{ON4 \times 2^M}{\left(\frac{PGA1}{Fac}\right)}$ |

In the above tables, the dark frames OFF1, OFF2, OFF3, and OFF4 are not generated by the optical sensor 110, and are equivalently considered as zero.

Figure 5:
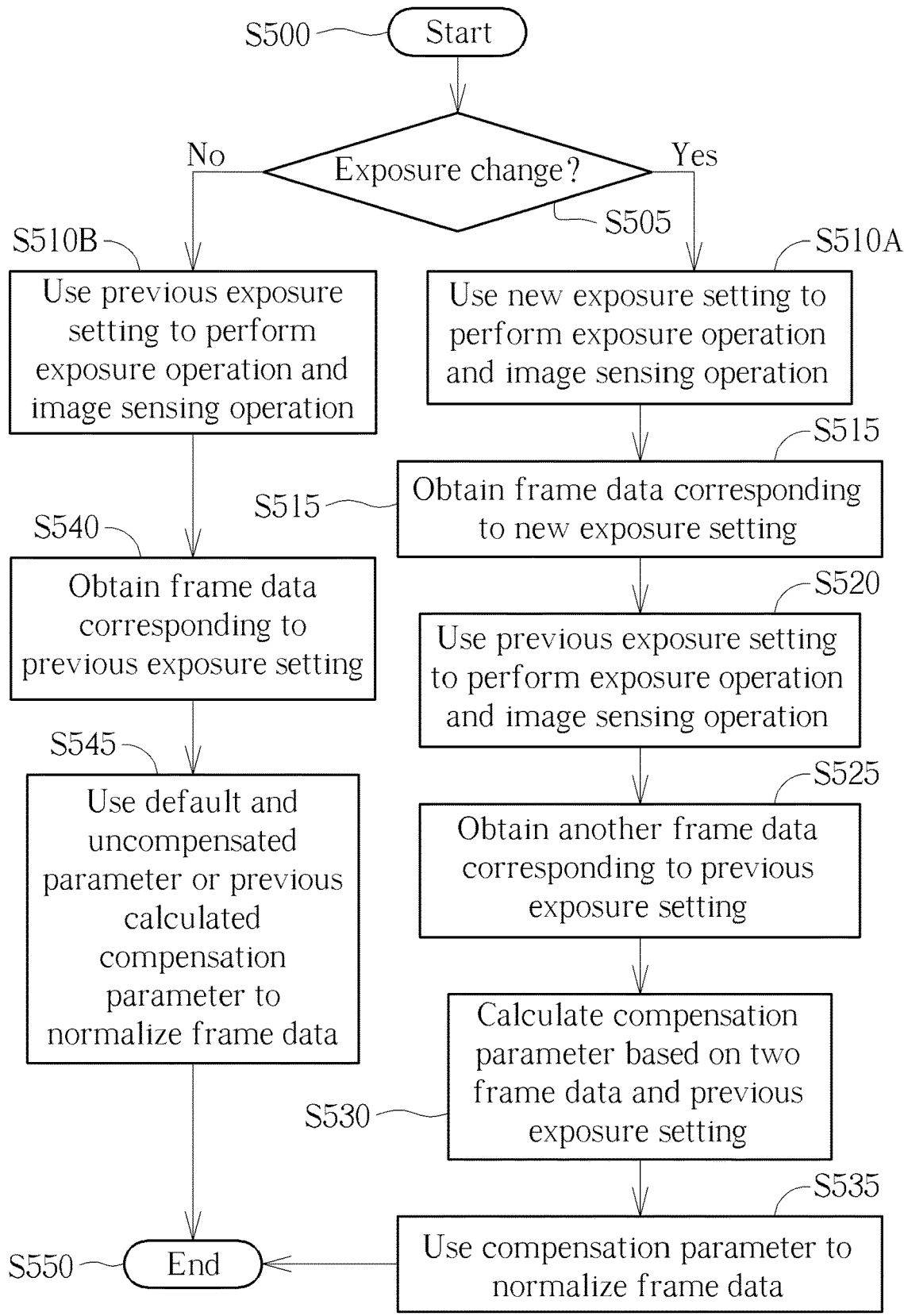
FIG. 5 is a flowchart diagram of the operations of the optical sensor device according to an embodiment of the invention.

FIG. 5 is a flowchart diagram of the operations of the optical sensor device 100 according to an embodiment of the invention. Provided that substantially the same result is achieved, the steps of the flowchart shown in FIG. 5 need not be in the exact order shown and need not be contiguous, that is, other steps can be intermediate. Steps are detailed in the following:

Step S500: Start;

Step S505: Determine whether an exposure adjustment operation occurs or not by using the DSP 115 of processing circuit 105; if the exposure adjustment operation is performed, then flow proceeds to Step S510A, otherwise, the flow proceeds to Step S510B;

Step S510A: Use a new exposure setting to perform an exposure operation and an image sensing operation of the optical sensor 110;

Step S510B: Use a previous exposure setting to perform an exposure operation and an image sensing operation of the optical sensor 110;

Step S515: Obtain a current frame data corresponding to the new exposure setting;

Step S520: Use a previous exposure setting to perform the exposure operation and the image sensing operation of the optical sensor 110;

Step S525: Obtain another current frame data corresponding to the previous exposure setting;

Step S530: Calculate a compensation parameter, used to normalize the output data of the ADC 145, based on the two current frame data and the previous exposure setting;

Step S535: Use the compensation parameter to normalize the frame data corresponding to the new exposure setting to mitigate signal nonlinearity;

Step S540: Obtain a current frame data corresponding to the previous exposure setting;

Step S545: Use a default and non-changed compensation parameter (e.g. one) or a previous calculated compensation parameter, calculated during a time period of a previous frame, to normalize the current frame data; and Step S550: End.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical sensor device, comprising:
a processing circuit having a digital-to-analog converter (DAC) which is used to convert a digital signal into an analog signal to make a driver circuit generate a driving current to drive a light emission unit; and
an optical sensor, coupled to the processing circuit, for receiving light associated with the light emission unit to generate at least one sensed image;
wherein, during a time period of a previous frame, the DAC makes the driver circuit drive the light emission unit with a second driving current corresponding to an exposure setting of the previous frame; during a first time period of a frame next to the previous frame, the DAC makes the driver circuit drive the light emission unit with a first driving current corresponding to a different exposure setting and the optical sensor generates a first frame data; and, when performing an exposure adjustment operation, during a second time period of the frame neighbor to the first time period of the frame, the DAC makes the driver circuit drive the light emission unit with the second driving current corresponding to the exposure setting of the previous frame and the optical sensor generates a second frame data, and the processing circuit is arranged to generate a normalized digital signal corresponding to the first frame data based on a relation between the first frame data and the second frame data.

2. The optical sensor device of claim 1, wherein the processing circuit is arranged to calculate a compensation parameter based on a difference between the first frame data and the second frame data and then to use the compensation parameter to normalize the first frame data.

3. The optical sensor device of claim 2, wherein the first driving current is generated by the driver circuit in response to a first offset signal applied by the DAC, and the second driving current is generated by the driver circuit in response to a second offset signal applied by the DAC; the second offset signal is different from the first offset signal.

4. The optical sensor device of claim 1, wherein the processing circuit is arranged to calculate a compensation parameter based on a ratio of the second frame data compared to the first frame data and then to use the compensation parameter to normalize the first frame data.

5. The optical sensor device of claim 4, wherein the first driving current is generated by the driver circuit in response to a first gain signal applied by the DAC, and the second driving current is generated by the driver circuit in response to a second gain signal applied by the DAC; the second gain signal is different from the first gain signal.

6. The optical sensor device of claim 1, wherein when the exposure adjustment operation is not performed for the frame, during the second time period of the frame, the DAC does not make the driver circuit drive the light emission unit with the second driving current, and the processing circuit is arranged to generate the normalized digital signal corresponding to the first frame data based on a previous relation calculated in the previous frame that the exposure adjustment operation is performed.

7. An optical sensor device, comprising:
a processing circuit having a digital-to-analog converter (DAC) which is used to convert a digital signal into an analog signal to make a driver circuit generate a driving current to drive a light emission unit; and
an optical sensor, coupled to the processing circuit, for receiving light associated with the light emission unit to generate at least one sensed image;
wherein the processing circuit further has a programmable gain amplifier used to amplify the at least one sense image to generate an amplified image signal to an analog-to-digital converter; during a time period of a previous frame, the programmable gain amplifier is arranged to generate the amplified image signal by using a second gain value corresponding to an exposure setting of the previous frame; during a first time period of a frame, the programmable gain amplifier is arranged to generate the amplified image signal by using a first gain value corresponding to a different exposure setting and the analog-to-digital converter generates a first frame data; and, when performing an exposure adjustment operation, during a second time period of the frame neighbor to the first time period of the frame, the programmable gain amplifier is arranged to generate the amplified image signal by using the second gain value corresponding to the exposure setting of the previous frame and the analog-to-digital converter generates a second frame data, and the processing circuit is arranged to generate a normalized digital signal corresponding to the first frame data based on a relation between the first frame data and the second frame data.

8. The optical sensor device of claim 7, wherein the processing circuit is arranged to calculate a compensation parameter based on a ratio of the second frame data compared to the first frame data and then to use the compensation parameter to normalize the first frame data.

9. The optical sensor device of claim 8, wherein the second gain value is determined by the processing circuit and is different from the first gain signal.

10. The optical sensor device of claim 7, wherein when the exposure adjustment operation is not performed for the frame, during the second time period of the frame, the programmable gain amplifier does not generate the amplified image signal by using the second gain value, and the processing circuit is arranged to generate the normalized digital signal corresponding to the first frame data based on a previous relation calculated in the previous frame that the exposure adjustment operation is performed.

11. A method of an optical sensor device, comprising:
providing a processing circuit having a digital-to-analog converter (DAC) which is used to convert a digital signal into an analog signal to make a driver circuit generate a driving current to drive a light emission unit;

providing an optical sensor coupled to the processing circuit for receiving light associated with the light emission unit to generate at least one sensed image;

using a first exposure setting to make the optical sensor generate a first frame data during a first time period of a frame;

using a second exposure setting to make the optical sensor generate a second frame data during a second time period of the frame neighbor to the first time period of the frame; and generating a normalized digital signal of an output frame according to the first frame data and the second frame data.

12. The method of claim 11, wherein the second exposure setting is an exposure setting used in a frame previously to the output frame, and the first exposure setting is an exposure setting used in a frame next to the output frame.

13. The method of claim 11, wherein the step of generating the normalized digital signal comprises:

calculating a compensation parameter based on a difference between the first frame data and the second frame data; and using the compensation parameter to normalize the first frame data.

14. The method of claim 13, wherein the first exposure setting corresponds to a first driving current which is generated in response to a first offset signal applied by the DAC, and the second exposure setting corresponds to a second driving current which is generated in response to a second offset signal applied by the DAC; the second offset signal is different from the first offset signal.

15. The method of claim 11, wherein the step of generating the normalized digital signal comprises:

calculating a compensation parameter based on a ratio of the second frame data compared to the first frame data; and using the compensation parameter to normalize the first frame data.

16. The method of claim 15, wherein the first exposure setting corresponds to a first driving current which is generated in response to a first gain signal applied by the DAC, and the second exposure setting corresponds to a second driving current which is generated in response to a second gain signal applied by the DAC; the second gain signal is different from the first gain signal.

17. The method of claim 11, further comprising:

when the exposure adjustment operation is not performed for the frame, not controlling the driver circuit drive the light emission unit with the second driving current during the second time period of the frame, and generating the normalized digital signal of an output frame according to the first frame data and the second frame data.

18. The method of claim 11, wherein the second exposure setting is an exposure setting used in a frame previously to the output frame, and the first exposure setting is an exposure setting used in a frame next to the output frame.

* * * * *